United States Patent
Yoshimi

(10) Patent No.: US 9,628,090 B2
(45) Date of Patent: Apr. 18, 2017

(54) SEMICONDUCTOR DEVICE AND CONTROL METHOD OF SEMICONDUCTOR DEVICE

(71) Applicant: FUJITSU LIMITED, Kawasaki-shi, Kanagawa (JP)

(72) Inventor: Koichi Yoshimi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/185,453

(22) Filed: Jun. 17, 2016

(65) Prior Publication Data

US 2017/0012629 A1    Jan. 12, 2017

(30) Foreign Application Priority Data

Jul. 9, 2015  (JP) ................................. 2015-137960

(51) Int. Cl.
| | |
|---|---|
| H03K 3/00 | (2006.01) |
| H03L 7/08 | (2006.01) |
| H01L 25/10 | (2006.01) |
| H03K 5/26 | (2006.01) |
| H03K 5/135 | (2006.01) |
| G11C 7/10 | (2006.01) |
| H03K 5/00 | (2006.01) |

(52) U.S. Cl.
CPC .......... *H03L 7/0807* (2013.01); *G11C 7/1051* (2013.01); *H01L 25/105* (2013.01); *H03K 5/135* (2013.01); *H03K 5/26* (2013.01); *H01L 2225/06548* (2013.01); *H01L 2225/1058* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 5,506,581 A | 4/1996 | Ino et al. | |
| 2001/0000693 A1* | 5/2001 | Hamamoto | .......... G11C 7/1072 365/230.08 |
| 2005/0007172 A1* | 1/2005 | Sadakata | ................ G11C 29/14 327/202 |
| 2005/0068062 A1* | 3/2005 | Yamasaki | ........ H03K 3/356113 326/81 |
| 2011/0093735 A1 | 4/2011 | Yoko et al. | |
| 2014/0008800 A1 | 1/2014 | Chen et al. | |
| 2014/0054742 A1 | 2/2014 | Katti | |

FOREIGN PATENT DOCUMENTS

| | | |
|---|---|---|
| JP | 06-197024 | 7/1994 |
| JP | 1995-245630 | 9/1995 |
| JP | 2011-081731 | 4/2011 |

* cited by examiner

*Primary Examiner* — Long Nguyen
(74) *Attorney, Agent, or Firm* — Fujitsu Patent Center

(57) ABSTRACT

While transmission of data to be transmitted and gap data to be transmitted by the same transmission path as that data is controlled so that a frequency of a data signal may become equal to or more than a certain frequency, a data output driver selects and outputs the data or the gap data as the data signal, a valid signal generation circuit outputs a valid signal that indicates whether or not the data is effective, and a reception circuit that is formed in a different die receives the data signal and the valid signal transmitted via the transmission path that includes a through silicon via and acquires the data from the data signal based on the valid signal.

8 Claims, 4 Drawing Sheets

F I G. 1
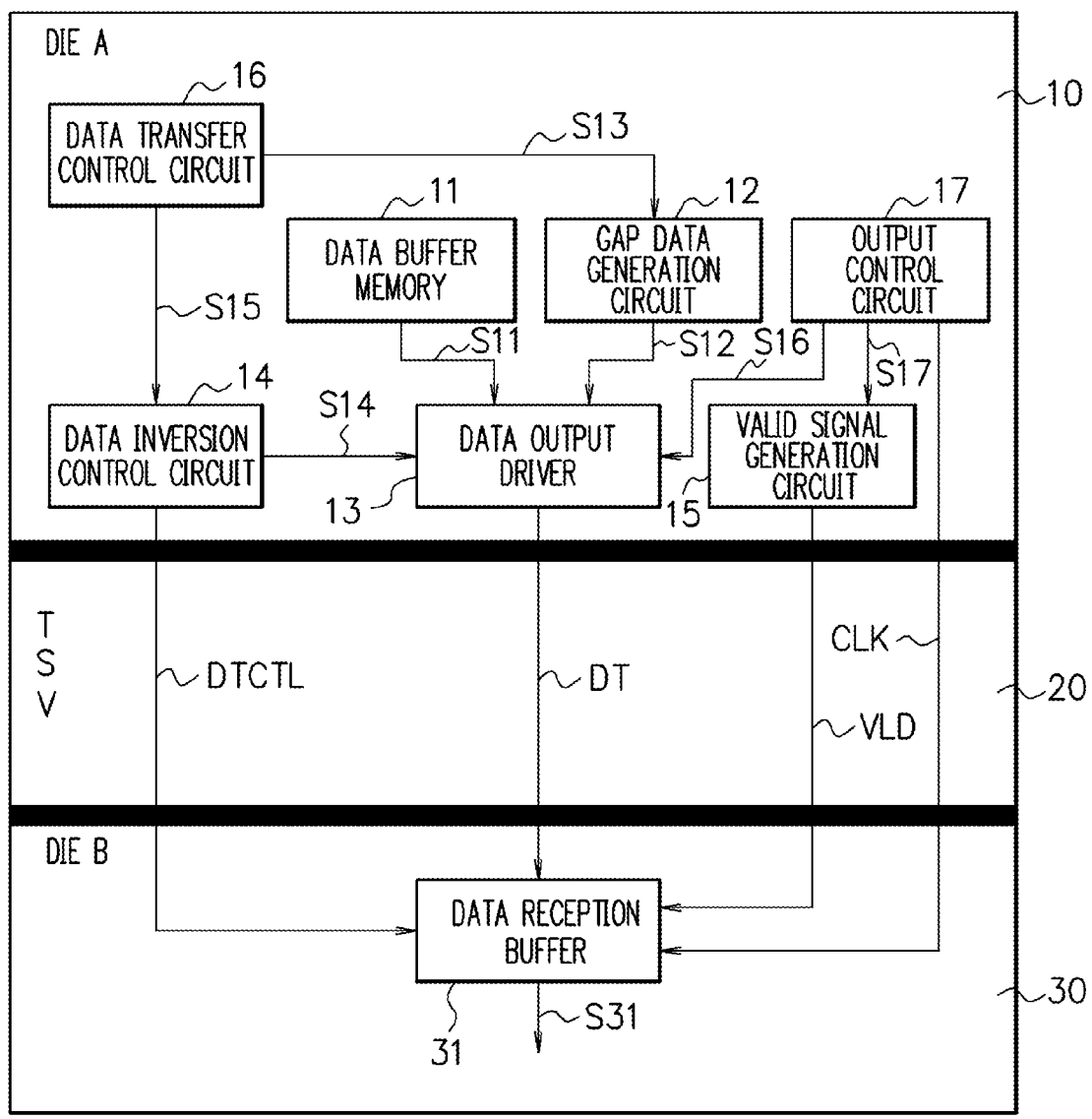

F I G. 3
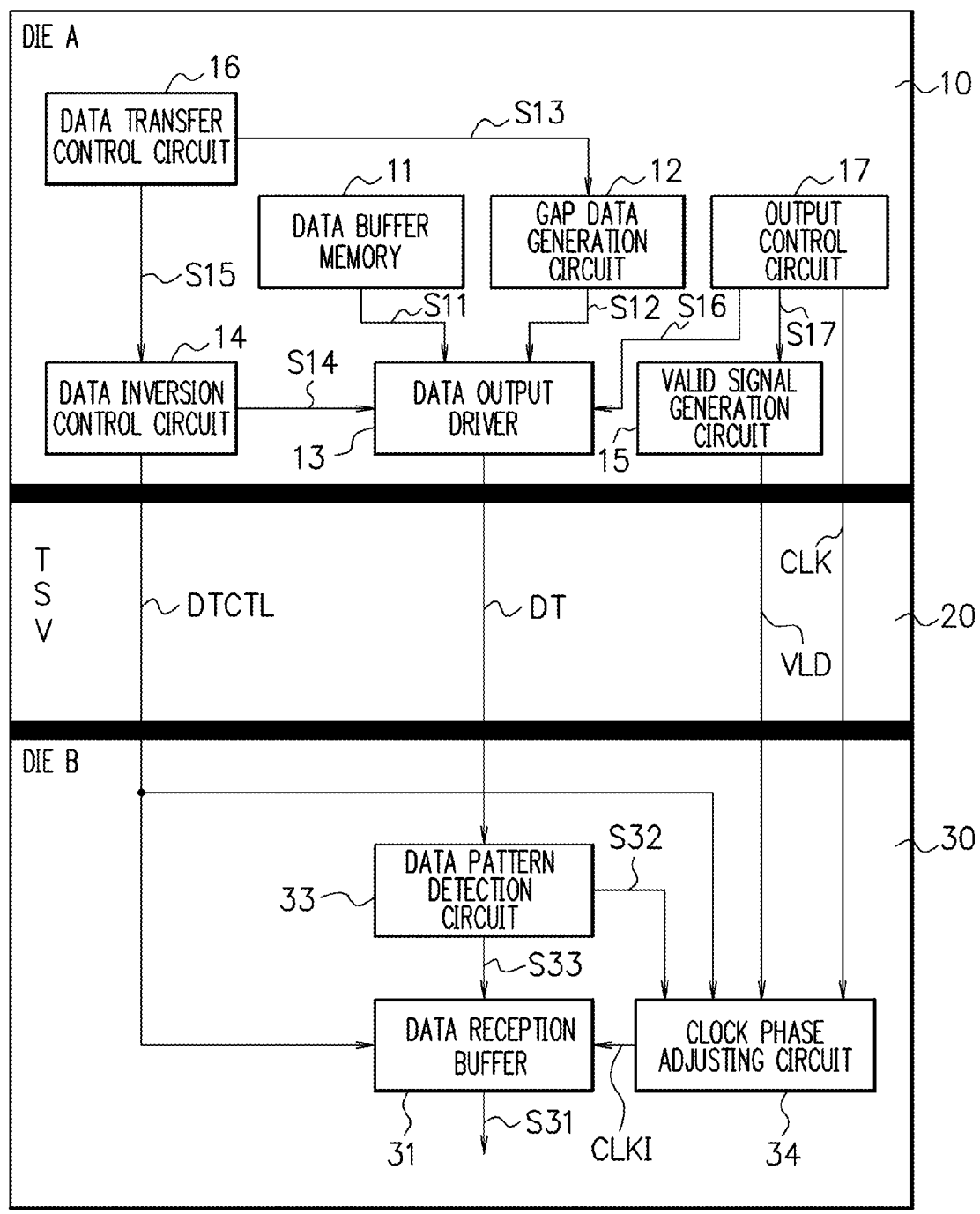

SEMICONDUCTOR DEVICE AND CONTROL METHOD OF SEMICONDUCTOR DEVICE

CROSS-REFERENCE TO RELATED APPLICATION

This application is based upon and claims the benefit of priority of the prior Japanese Patent Application No. 2015-137960, filed on Jul. 9, 2015, the entire contents of which are incorporated herein by reference.

FIELD

The embodiments discussed herein are directed to a semiconductor device and a control method of the semiconductor device.

BACKGROUND

A development cost of a semiconductor device is increasing, and instead of developing a die with a large area, a method of reducing the development cost by functional decomposition has come to be required. In view of lowering a cost of an entire system, a semiconductor device of three-dimensional structure in which dies are stacked attracts attention. As illustrated in FIG. 5 as an example, it is possible to curtail a system area by mounting a top die 51 of dies and the like of a memory circuit above a bottom die 52 of dies and the like of a processor core circuit, for example.

In the semiconductor device of three-dimensional structure, data transmission between dies is carried out by using a through silicon via (TSV) 53 penetrating a semiconductor substrate 52S, and a micro-bump 54. By connecting a plurality of dies by using the through silicon via to shorten a transmission distance of a data signal, data transmission at a high speed and at a low power can be realized, so that it becomes possible to carry out information processing efficiently. In FIG. 5, a reference numeral 55 indicates a solder bump for package connection. In a case where a die is mounted further above the top die 51, a through silicon via penetrating a semiconductor substrate 51S is provided, and data transmission is carried out by using that through silicon via and a micro-bump.

Not only a shape parameter value in manufacturing a through silicon via penetrating a semiconductor substrate but also electric characteristic values of the through silicon via such as a resistance characteristic (R), an inductor characteristic (L), and a capacity characteristic (C) are different depending on a semiconductor foundry. Also the through silicon via has a problem that the characteristic value of the through silicon via fluctuates dynamically during an operation of a semiconductor device due to its structure. For example, a barrier layer is provided between the semiconductor substrate and the through silicon via penetrating the semiconductor substrate, and a structure equivalent to a transistor is formed by the semiconductor substrate, the barrier layer, and the through silicon via. Therefore, when a signal is transmitted via the through silicon via, there is a possibility that capacity fluctuation in a through silicon via occurs in correspondence with a frequency of the transmitted signal (MIS (Metal-Insulator-Semiconductor) effect), whereby delay of a transmission path which includes the through silicon via sometimes fluctuates dynamically.

In general, in designing a semiconductor device, when extraction of parameters such as a resistance and a capacity of a MOS transistor, a metal wiring or the like is carried out, the extraction is simply based on a shape of a device only. For example, in an electronic design automation (EDA) tool as of now, a through silicon via being not regarded as a column-shaped transistor, a characteristic is extracted based on a three-dimensional shape, and thus it is not possible to carry out automatic placement and routing, calculation of a delay value or the like in which fluctuation of a characteristic due to various actions occurring by the MIS effect or the like is taken into consideration. Consequently, a user of the semiconductor device conceives various calculation formulas and calculates characteristic values based on semiconductor parameters in order to investigate characteristics of the through silicon via, then creates test chips numerous times, and compares and evaluates calculation values and actual characteristic values of the through silicon via having been measured, thereby to figure out an RLC characteristic of the through silicon via of an actual chip. However, this method leads to an increase in development cost.

It is general that a foundry does not disclose a characteristic value of a semiconductor which relates to a performance of a semiconductor device, and it is quite difficult for a user designing the semiconductor device to obtain such characteristic parameter values. In a case where a through silicon via is manufactured by OSAT (outsource assembly and test) or the like, the characteristic depends also on a manufacturing method thereof. Consequently, there occurs a state where the user designing the semiconductor device cannot confirm or control characteristic fluctuation of the through silicon via. Under certain circumstances, respin (redesign) of the semiconductor device is also required due to characteristic fluctuation of the through silicon via, which leads to increases in entire design cost and design time.

In order to suppress fluctuation of a capacity value of a through silicon via, there is suggested a method in which the through silicon vias are created in correspondence with kinds of signals transmitted by the through silicon vias, and a method in which the through silicon via has a special structure to suppress capacity fluctuation (for example, see Patent Documents 1, 2). However, creating the through silicon vias individually or making the through silicon via having the special structure leads to an increase in area or an increase in cost.

[Patent Document 1] U.S. Patent Application Publication No. 2014/0008800

[Patent Document 2] U.S. Patent Application Publication No. 2014/0054742

When a capacity value of a through silicon via fluctuates dependently on a frequency of a signal passing through the through silicon via, an RC characteristic of a transmission path which includes the through silicon via changes and a delay value fluctuates, so that a propagation velocity of the signal changes. Consequently, there is an apprehension that signal transmission between dies fails. One of causes for the above problem is that continuation of the same data in the signals transmitted by the through silicon via makes the frequencies of the signals low. When the same data continues, the frequencies of the signals flowing on a signal line of that one bit become low apparently, so that a capacity of the through silicon via becomes large by an MIS effect. For example, a capacity value at a time of low frequency signal becomes three to five times as large as a capacity value at a time of high frequency signal. Consequently, a differential delay corresponding to a repetition rate of change of data occurs dependently on a pattern of data to be transmitted, and there is a possibility that signal transmission between dies fails.

If characteristic fluctuation due to the MIS effect can be estimated, it is possible to cope with the above by executing a simulation or the like at a time of designing. However, as described above, it is often the case that a characteristic value (parameter value) of a semiconductor which is necessary for verifying the MIS effect is not disclosed, and a user designing a semiconductor device is often unable to obtain those characteristic values. Though there is a method of suppressing characteristic fluctuation by the structure of the through silicon via as described above, that method leads to an increase in area or an increase in cost.

SUMMARY

An aspect of a semiconductor device includes: a holding circuit that holds first data to be transmitted; a data generation circuit that generates second data to be transmitted by the same transmission path as the first data; a control circuit that controls transmission of the first data and the second data so that a frequency of a data signal becomes equal to or more than a certain frequency; an output circuit that selects and outputs the first data or the second data as the data signal in correspondence with control by the control circuit; a valid signal generation circuit that outputs a valid signal that indicates that the data is effective; and a reception circuit that is formed in a different die, receives the data signal and the valid signal transmitted via the transmission path that includes a through silicon via, and acquires the first data from the data signal based on the valid signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a semiconductor device in a first embodiment;

FIG. 3 is a diagram illustrating a configuration example of a semiconductor device in a third embodiment;

DESCRIPTION OF EMBODIMENTS

Figure 2:
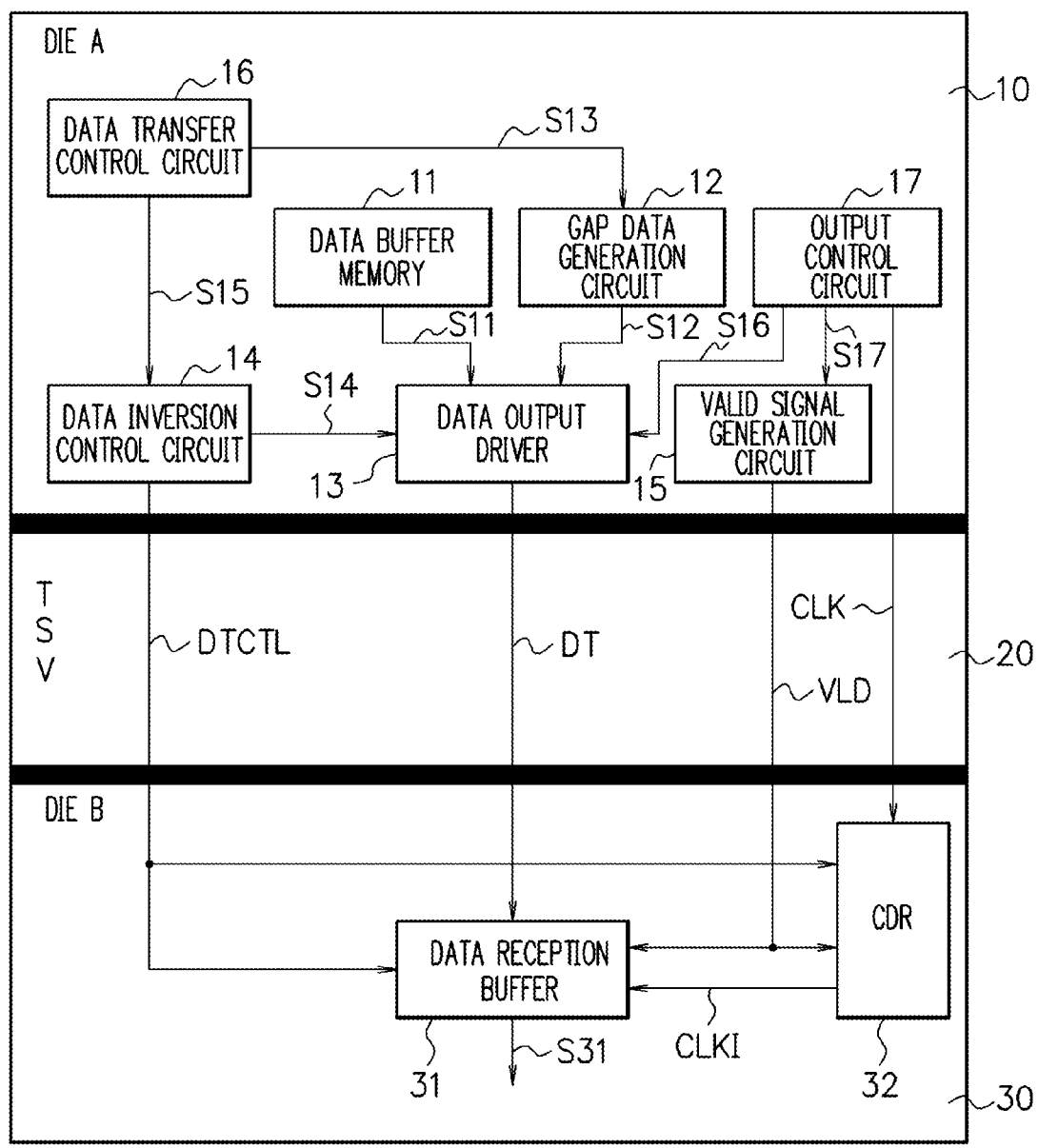
FIG. 2 is a diagram illustrating a configuration example of a semiconductor device in a second embodiment.

Hereinafter, embodiments will be described based on the drawings. In each embodiment described below, as an example, there are represented two dies in a semiconductor device of a three-dimensional structure where a plurality of dies are stacked, and there is represented a case where data is transmitted from one die A to the other die B via a transmission path which includes a through silicon via (TSV) penetrating a semiconductor substrate. However, the present embodiments are not limited to the above, and in a case where the data is transmitted from the die B to the die A for example, it suffices that the die B is constituted similar to the die A and at the same time the die A is constituted similar to the die B. Further, data transmission is possible by providing and connecting through silicon vias (TSV) penetrating semiconductor substrates between adjacent dies, not only between the die A and the die B as illustrated but also between other dies.

First Embodiment

A first embodiment will be described.

FIG. 1 is a diagram illustrating a configuration example of a semiconductor device in the first embodiment. In FIG. 1, a circuit of a side to transmit data is formed in a die A 10. The die A 10 includes a data buffer memory 11, a gap data generation circuit 12, a data output driver 13, a data inversion control circuit 14, a valid signal generation circuit 15, a data transfer control circuit 16, and an output control circuit 17. A circuit of a side to receive the data is formed in a die B 30. The die B 30 includes a data reception buffer 31. In FIG. 1, though a through silicon via (TSV) 20 penetrating a semiconductor substrate is illustrated as one region, the through silicon via (TSV) 20 is each provided for every signal line.

The data buffer memory 11 holds data which is inputted from a processor, a control engine or the like and transmitted to the die B 30. The data held by the data buffer memory 11 may be scrambled data or may be unscrambled data.

The gap data generation circuit 12 generates gap data to be sent to the die B 30 in a gap period during which effective data is not sent. The gap data which the gap data generation circuit 12 generates is data such as a pseudo random bit sequence (PRBS) in which data "0" and data "1" disperse moderately. The gap data generation circuit 12 generates the gap data by randomly combining the data "0" and the data "1" so that frequencies of data signals transmitted in adjacent gap periods may become equal to or more than a certain frequency, for example. As a result of sending the gap data in which the data "0" and the data "1" disperse by the through silicon via (TSV) 20, it is possible to suppress the frequency of the signal passing through the through silicon via (TSV) 20 from becoming low and to fix a capacity value of the through silicon via (TSV) 20, whereby occurrence of sharp capacity fluctuation can be prevented.

The data output driver 13 selects data S11 from the data buffer memory 11 or gap data S12 from the gap data generation circuit 12 and outputs as a data signal DT, in accordance with a control signal S16 from the output control circuit 17. On this occasion, the data output driver 13 non-inverts or inverts and outputs the data S11 and the gap data S12, in accordance with a data control signal S14 from the data inversion control circuit 14. The data signal DT outputted from the data output driver 13 is outputted to the die B 30 via the through silicon via (TSV) 20.

The data inversion control circuit 14 generates the data control signal S14 which instructs whether or not to invert data and outputs the data control signal S14 to the data output driver 13, in correspondence with an inversion control signal S15 from the data transfer control circuit 16. The data inversion control circuit 14 outputs a data inversion signal DTCTL which indicates whether or not the data outputted from the data output driver 13 by the data signal DT is inverted data, in correspondence with the inversion control signal S15 from the data transfer control circuit 16. The data inversion signal DTCTL outputted from the data inversion control circuit 14 is outputted to the die B 30 via the through silicon via (TSV) 20.

As described above, by appropriately inverting the data which the data output driver 13 outputs in correspondence with the instruction from the data inversion control circuit 14, it is possible to suppress the frequency of the signal passing through the through silicon via (TSV) 20 from becoming low and to prevent occurrence of capacity fluctuation in the through silicon via (TSV) 20. Such inversion of data is carried out, for example, at a specific repetition rate and at random or according to a specific pattern so that the data passing through the through silicon via (TSV) 20 may be changed at a certain frequency or more to enable the frequency of the data signal DT to be fixed in a certain range.

It suffices that the numbers of signal lines of the data control signal S14 and the data inversion signal DTCTL which are outputted from the data inversion control circuit 14 are appropriately set in correspondence with a specification or the like, and in the present embodiment, it is presumed that one data control signal S14 and one data inversion signal DTCTL are provided for every plurality of bits (for example, 8 bits being 1 byte) of the data signal DT. With regard to the data inversion signal DTCTL outputted from the data inversion control circuit 14 to the data reception buffer 31 of the die B via the through silicon via (TSV) 20, a change frequency is controlled so that the capacity fluctuation in the through silicon via (TSV) 20 may not exceed a certain magnitude.

The valid signal generation circuit 15 outputs a valid signal VLD which indicates whether or not the data outputted from the data output driver 13 by the data signal DT is effective data, in correspondence with a control signal S17 from the output control circuit 17. In other words, the valid signal generation circuit 15 outputs the valid signal VLD which indicates that the data is effective in a period during which the data output driver 13 selects the data S11 from the data buffer memory 11 and outputs as the data signal DT. On the other hand, the valid signal generation circuit 15 outputs the valid signal VLD which indicates that the data is not effective in a period during which the data output driver 13 selects the gap data S12 from the gap data generation circuit 12 and outputs as the data signal DT. The valid signal VLD outputted from the valid signal generation circuit 15 is outputted to the die B 30 via the through silicon via (TSV) 20.

The data transfer control circuit 16 generates and outputs a gap width control signal S13 to the gap data generation circuit 12, and generates and outputs an inversion control signal S15 to the data inversion control circuit 14, in correspondence with the data to be transmitted from the die A 10 to the die B 30. The gap width control signal S13 is a signal which controls a width of a gap period during which effective data is not sent, and insertion/non-insertion, an interval, and the width of the gap period by the gap width control signal S13 can be altered arbitrarily. By providing the gap period during which frequency fluctuation of the data signal DT is generated and making the width of the gap period large or small in correspondence with the gap width control signal S13, a change frequency of the data signal DT is controlled so as not to allow capacity fluctuation in the through silicon via (TSV) 20 to exceed a certain magnitude. The inversion control signal S15 is a signal which controls whether or not to carry out inversion of the data to be outputted as the data signal DT.

The output control circuit 17 outputs control signals S16, S17 related to data transmission from the die A 10 to the die B 30. The output control circuit 17 outputs a clock signal CLK which is sent together with the data signal DT. The clock signal CLK outputted from the output control circuit 17 is outputted to the die B 30 via the through silicon via (TSV) 20.

In correspondence with the control signals S16, S17 from the output control circuit 17, in a period during which effective data is sent, the data output driver 13 outputs data S11 as the data signal DT and the valid signal generation circuit 15 outputs a valid signal VLD which indicates that the data is valid. In correspondence with the control signals S16, S17 from the output control circuit 17, in the gap period, the data output driver 13 outputs gap data S12 as the data signal DT and the valid signal generation circuit 15 outputs a valid signal VLD which indicates that the data is not effective.

Into the data reception buffer 31, the data signal DT, the data inversion signal DTCTL, the valid signal VLD, and the clock signal CLK are inputted from the die A 10 via the through silicon via (TSV) 20. The data reception buffer 31 decides whether or not the data inputted by the data signal DT is effective based on the valid signal VLD, and when the data is effective data, the data reception buffer 31 acquires the data from the data signal DT by using the clock signal CLK. On this occasion, the data reception buffer 31 decides whether or not the data is inverted based on the data inversion signal DTCTL, and if inverted, the data reception buffer 31 inverts the acquired data to make the data be the original data. Then, the data reception buffer 31 supplies the acquired data to an inner circuit or the like of the die B 30 as data input S31.

In the semiconductor device of three-dimensional structure, since giving the same clock to all the dies is not easy, in the present embodiment the clock signal CLK is given together with the data signal DT from the die A 10 to the die B 30. However, when the data signal DT is acquirable by a clock signal within the die B 30, it is possible that the clock signal CLK is not given from the die A 10 to the die B 30.

According to the first embodiment, by appropriately providing the gap period and sending the gap data so that the signal transmitted via the through silicon via (TSV) 20 may have a frequency equal to or more than a certain frequency, it is possible to suppress frequency fluctuation of the signal passing through the through silicon via (TSV) 20 and to prevent occurrence of capacity fluctuation in the through silicon via (TSV) 20. By inverting and sending the data so that the signal transmitted via the through silicon via (TSV) 20 may have a frequency equal to or more than a certain frequency in correspondence with the data inversion signal DTCTL, it is possible to suppress frequency fluctuation of the signal passing through the through silicon via (TSV) 20 and to prevent occurrence of capacity fluctuation in the through silicon via (TSV) 20.

As described above, by controlling the signal passing through the through silicon via (TSV) 20, dynamic characteristic fluctuation in the through silicon via (TSV) 20 is suppressed, and it is possible to reduce fluctuation of delay of the signal and to realize stable data transfer. It is possible to prevent occurrence of capacity fluctuation in the through silicon via (TSV) 20 regardless of characteristic fluctuation of the through silicon via (TSV) 20 which is dependent on a characteristic value (parameter value) of the semiconductor, and design by using an electronic design automation tool or the like becomes possible, so that an increase in design cost or design time can be suppressed.

Second Embodiment

Next, a second embodiment will be described.

FIG. 2 is a diagram illustrating a configuration example of a semiconductor device in the second embodiment. In FIG. 2, the same reference numeral is given to a component having the same function as that of a component illustrated in FIG. 1, and redundant explanation will be omitted. In the second embodiment, a configuration on a side to send data which is formed in a die A 10 is similar to that in the first embodiment. In the second embodiment, a die B 30 in which a circuit of a side to receive data is formed includes, in addition to a data reception buffer 31, a clock data recovery (CDR) circuit 32.

Into the clock data recovery circuit 32, a data inversion signal DTCTL and a valid signal VLD are inputted from the die A 10 via a through silicon via (TSV) 20. The clock data recovery circuit 32 generates an internal clock signal CLKI based on the data inversion signal DTCTL from the die A 10. Here, since the data inversion signal DTCTL from the die A 10 is a high frequency signal which does not allow capacity fluctuation of the through silicon via (TSV) 20 to exceed a certain magnitude, it is possible to generate the internal clock signal CLKI for acquiring a data signal DT by using the data inversion signal DTCTL.

An operation of the clock data recovery circuit 32 can be controlled by a valid signal VLD from the die A 10. When the valid signal VLD from the die A 10 indicates that data is effective, the clock data recovery circuit 32 operates, and when the valid signal VLD indicates that the data is not effective, the clock data recovery circuit 32 halts the operation. By halting the operation of the clock data recovery circuit 32 in a period during which the data is not effective as described above, a power consumption can be reduced.

Into the data reception buffer 31, the data signal DT, the data inversion signal DTCTL, and the valid signal VLD are inputted from the die A 10 via the through silicon via (TSV) 20 and the internal clock signal CLKI is inputted from the clock data recovery circuit 32. The data reception buffer 31 decides whether or not the data inputted by the data signal DT is effective based on the valid signal VLD, and when the data is effective data, the data reception buffer 31 acquires the data from the data signal DT by using the internal clock signal CLKI. On this occasion, the data reception buffer 31 decides whether or not the data inversion signal DTCTL is asserted, and if asserted, the data reception buffer 31 inverts the acquired data to make the data be original data. Then, the data reception buffer 31 supplies the acquired data to an internal circuit or the like of the die B 30 as data input S31.

According to the second embodiment, by controlling the signal passing through the through silicon via (TSV) 20, dynamic characteristic fluctuation in the through silicon via (TSV) 20 is suppressed, so that fluctuation of delay of the signal can be reduced to realize stable data transfer. Regardless of characteristic fluctuation of the through silicon via (TSV) 20 which is dependent on a characteristic value (parameter value) of a semiconductor, occurrence of capacity fluctuation in the through silicon via (TSV) 20 can be prevented and design by using an electronic design automation tool or the like becomes possible, so that an increase in design cost or design time can be suppressed. By using the internal clock signal CLKI generated by the clock data recovery circuit 32, a timing accuracy of data in the data signal DT and a clock signal can be improved.

Third Embodiment

Next, a third embodiment will be described.

Figure 4:
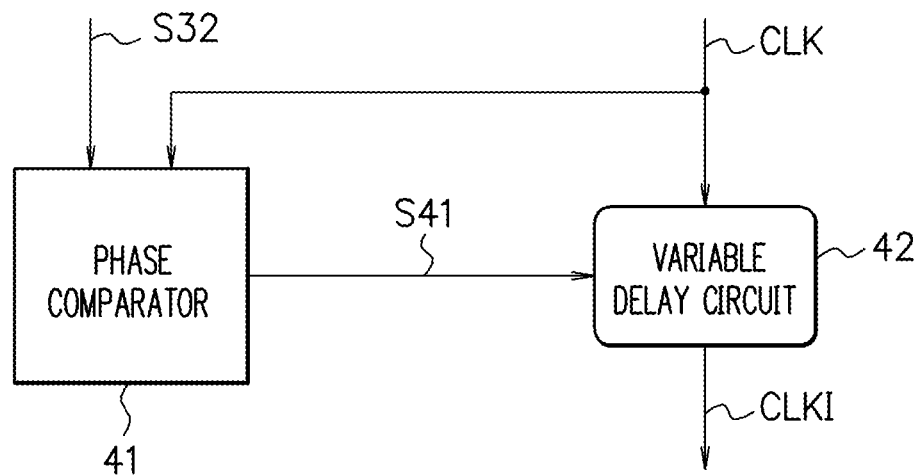
FIG. 4 is a diagram illustrating a configuration example of a clock phase adjustment circuit in the third embodiment.
Figure 5:
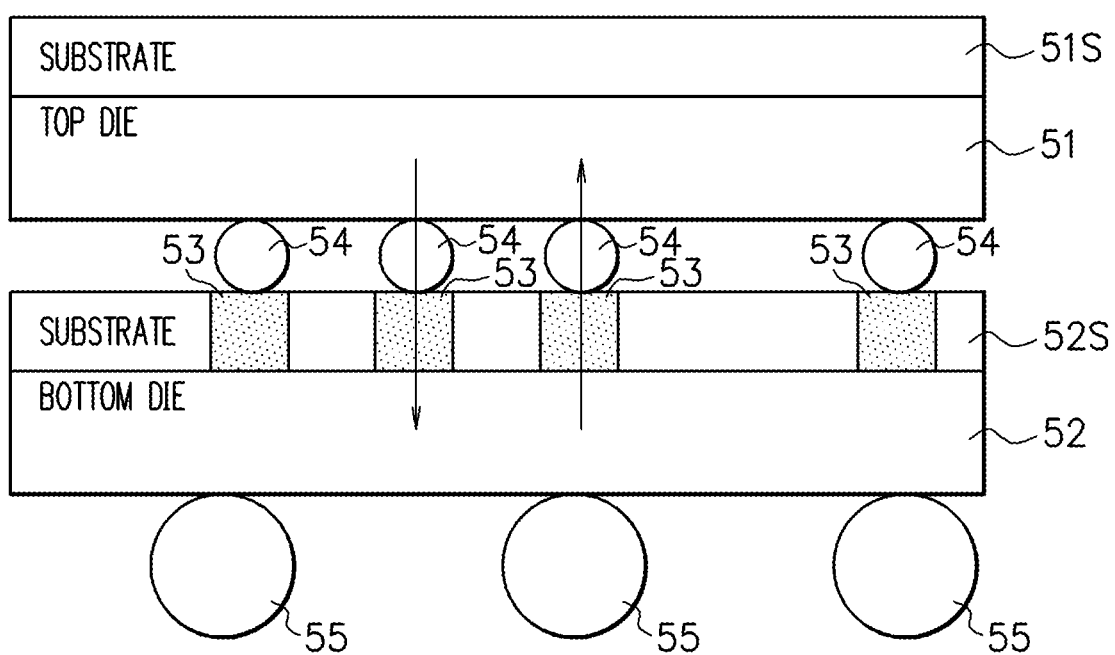
FIG. 5 is a cross-sectional view illustrating a configuration example of a semiconductor device of three-dimensional structure.

FIG. 3 is a diagram illustrating a configuration example of a semiconductor device in the third embodiment. In FIG. 3, the same reference numeral is given to a component having the same function as that of a component illustrated in FIG. 1, and redundant explanation will be omitted. In the third embodiment, a configuration on a side to send data which is formed in a die A 10 is similar to that in the first embodiment. In the third embodiment, a die B 30 in which a circuit of a side to receive data is formed has, in addition to a data reception buffer 31, a data pattern detection circuit 33 and a clock phase adjusting circuit 34. The clock phase adjusting circuit 34 has a phase comparator 41 and a variable delay circuit 42, as illustrated in FIG. 4.

The data pattern detection circuit 33, extracting an inverted part of a data signal DT inputted from the die A 10 via a through silicon via (TSV) 20, detects its phase and outputs a phase detection signal S32 to the clock phase adjusting circuit 34.

The phase comparator 41 of the clock phase adjusting circuit 34 compares phases of a clock signal CLK inputted from the die A 10 via the through silicon via (TSV) 20 and of the phase detection signal S32 from the data pattern detection circuit 33, and outputs a phase shift signal S41 corresponding to a comparison result to the variable delay circuit 42. The variable delay circuit 42 shifts the phase of the clock signal CLK inputted from the die A 10 via the through silicon via (TSV) 20 and outputs an internal clock signal CLKI for acquiring data from the data signal DT, in correspondence with the phase shift signal S41.

An operation of the clock phase adjusting circuit 34 can be controlled by a valid signal VLD from the die A 10. When the valid signal VLD from the die A 10 indicates that data is effective, the clock phase adjusting circuit 34 operates, and when the valid signal VLD indicates that the data is not effective, the clock phase adjusting circuit 34 halts the operation. By halting the operation of the clock phase adjusting circuit 34 in a period during which the data is not effective as described above, a power consumption can be reduced. By using not only a phase detection signal S32 from the data pattern detection circuit 33 but also a data inversion signal DTCTL inputted from the die A 10 via the through silicon via (TSV) 20 for adjustment of the clock phase, phase adjustment of a higher accuracy becomes possible.

The data reception buffer 31 decides whether or not the data inputted by the data signal DT is effective based on the valid signal VLD, and when the data is effective data, the data reception buffer 31 acquires the data from the data signal DT by using the internal clock signal CLKI. On this occasion, the data reception buffer 31 decides whether or not the data inversion signal DTCTL is asserted, and if asserted, the data reception buffer 31 inverts the acquired data to make the data be original data. Then, the data reception buffer 31 supplies the acquired data to an inner circuit or the like of the die B 30 as data input S31.

According to the third embodiment, similarly to in the first embodiment, by controlling the signal passing through the through silicon via (TSV) 20, dynamic characteristic fluctuation in the through silicon via (TSV) 20 is suppressed, so that fluctuation of delay of the signal can be reduced to realize stable data transfer. Regardless of characteristic fluctuation of the through silicon via (TSV) 20 which is dependent on a characteristic value (parameter value) of a semiconductor, occurrence of capacity fluctuation in the through silicon via (TSV) 20 can be prevented and design by using an electronic design automation tool or the like becomes possible, so that an increase in design cost or design time can be suppressed. Phase of other signals are also controlled by the clock phase adjusting circuit 34.

When a toggle amount (repetition rate of change of data) of a data pattern transmitted via the through silicon via (TSV) 20 is smaller than a certain amount (frequency of data is equal to or less than a certain frequency), the internal clock signal CLKI whose phase is delayed by a certain amount by the clock phase adjusting circuit 34 is outputted, and when the toggle amount of the data pattern is larger than the certain amount (frequency of data is equal to or larger than a certain frequency), the internal clock signal CLKI whose phase is advanced by a certain amount by the clock phase adjustment circuit 34 is outputted. As described above, by adjusting the phase of the internal clock signal CLKI in correspondence with the data pattern transmitted via the through silicon via (TSV) 20, it is possible to cope with delay fluctuation in the through silicon via (TSV) 20 by slight addition of a circuit, so that a timing accuracy of data in the data signal DT and a clock signal can be improved.

The aforementioned embodiments merely illustrate concrete examples of implementing the present invention and are not intended to limit the interpretation of the technical scope of the present invention. In other words, the present invention can be implemented in various manners without departing from the technical spirits or main features thereof.

In an aspect of the embodiments, by controlling the signal passing through the through silicon via, it is possible to suppress dynamic characteristic fluctuation in the through silicon via while suppressing an increase in cost, so that fluctuation of delay of the signal can be reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
    a holding circuit that holds first data to be transmitted;
    a data generation circuit that generates second data to be transmitted by the same transmission path as the first data;
    a control circuit that controls transmission of the first data and the second data so that a frequency of a data signal becomes equal to or more than a certain frequency;
    an output circuit that selects and outputs the first data held by the holding circuit or the second data generated by the data generation circuit as the data signal in correspondence with control by the control circuit;
    a valid signal generation circuit that outputs a valid signal that indicates that the data is effective when the output circuit is outputting the first data; and
    a reception circuit that is formed in a second die different from a first die that includes the holding circuit, the data generation circuit, the control circuit, the output circuit, and the valid signal generation circuit, receives the data signal and the valid signal transmitted from the first die via the transmission path that includes a through silicon via, and acquires the first data from the data signal based on the valid signal.

2. The semiconductor device according to claim 1, comprising
    an inversion control circuit that outputs an inversion control signal that indicates whether or not the data transmitted by the data signal is inverted data, in the first die,
    wherein the output circuit non-inverts or inverts and outputs the data to be outputted as the data signal in correspondence with an instruction from the inversion control circuit, and
    wherein the reception circuit inverts the acquired data when the inversion control signal transmitted from the first die indicates that the data is inverted data.

3. The semiconductor device according to claim 2, comprising
    a clock generation circuit that generates a clock signal used to acquire the first data in the reception circuit based on the inversion control signal transmitted from the first die, in the second die.

4. The semiconductor device according to claim 3,
    wherein the clock generation circuit halts an operation in a period during that the valid signal indicates that the data is not effective.

5. The semiconductor device according to claim 2, comprising
    a clock generation circuit that adjusts a phase of a clock signal transmitted together with the data signal from the first die and generates a clock signal used to acquire the first data in the reception circuit, in correspondence with a repetition rate of change of the data signal transmitted from the first die, in the second die.

6. The semiconductor device according to claim 5,
    wherein the clock generation circuit halts an operation in a period during that the valid signal indicates that the data is not effective.

7. A control method of a semiconductor device in that a first die and a second die are connected by a transmission path that includes a through silicon via, the control method comprising:
    controlling, by a control circuit in the first die, transmission of first data and second data to be transmitted by the same transmission path so that a frequency of a data signal becomes equal to or more than a certain frequency;
    selecting and outputting, by an output circuit in the first die, the first data held by a holding circuit in the first die or the second data generated by a data generation circuit in the first die as the data signal in correspondence with control by the control circuit;
    outputting, by a valid signal generation circuit in the first die, a valid signal that indicates that the data is effective when the first data is being outputted as the data signal;
    receiving, by a reception circuit in the second die, the data signal and the valid signal transmitted from the first die via the transmission path; and
    acquiring, by the reception circuit, the first data from the data signal based on the valid signal.

8. The control method of the semiconductor device according to claim 7, comprising
    outputting, by an inversion control circuit in the first die, an inversion control signal that indicates whether or not the data transmitted by the data signal is inverted data,
    wherein, in the outputting by the output circuit, data is non-inverted or inverted in correspondence with an instruction from the inversion control circuit and outputted as the data signal, and
    wherein, in the acquiring by the reception circuit, the acquired data is inverted when the inversion control signal transmitted from the first die indicates that the data is inverted data.

* * * * *